(12) United States Patent
Tanabe

(10) Patent No.: US 7,965,753 B2
(45) Date of Patent: Jun. 21, 2011

(54) MONOLITHIC SEMICONDUCTOR LASER

(75) Inventor: Tetsuhiro Tanabe, Kyoto (JP)

(73) Assignee: Rohm Co., Ltd., Kyoto-Shi (JP)

( * ) Notice: Subject to any disclaimer, the term of this patent is extended or adjusted under 35 U.S.C. 154(b) by 114 days.

(21) Appl. No.: 11/990,843

(22) PCT Filed: Aug. 23, 2006

(86) PCT No.: PCT/JP2006/316476
§ 371 (c)(1),
(2), (4) Date: Feb. 22, 2008

(87) PCT Pub. No.: WO2007/023845
PCT Pub. Date: Mar. 1, 2007

(65) Prior Publication Data
US 2009/0086781 A1    Apr. 2, 2009

(30) Foreign Application Priority Data

Aug. 24, 2005  (JP) ................ 2005-242327

(51) Int. Cl.
*H01S 5/00* (2006.01)
(52) U.S. Cl. .................................... 372/46.01
(58) Field of Classification Search ........... 372/46.01
See application file for complete search history.

(56) References Cited

U.S. PATENT DOCUMENTS

| 6,618,420 | B1 | 9/2003 | Gen-Ei et al. |
| 6,738,402 | B1 | 5/2004 | Hosoda et al. |
| 2003/0012241 | A1 | 1/2003 | Onishi |
| 2003/0042492 | A1 | 3/2003 | Watanabe |
| 2004/0062285 | A1 | 4/2004 | Uchizaki et al. |
| 2004/0114651 | A1* | 6/2004 | Tanaka et al. ............ 372/46 |
| 2005/0008054 | A1 | 1/2005 | Ukai |
| 2005/0069005 | A1 | 3/2005 | Nishida et al. |

FOREIGN PATENT DOCUMENTS

| JP | 2000-011417 | 1/2000 |
| JP | 2000-299529 | 10/2000 |
| JP | 2001-203423 | 7/2001 |
| JP | 2001-345514 | 12/2001 |
| JP | 2002-111136 | 4/2002 |
| JP | 2002111136 A * | 4/2002 |
| JP | 2002-197707 | 7/2002 |
| JP | 2002197707 A * | 7/2002 |

* cited by examiner

*Primary Examiner* — Minsun Harvey
*Assistant Examiner* — Patrick Stafford
(74) *Attorney, Agent, or Firm* — Rabin & Berdo, PC

(57) ABSTRACT

An infrared element (10a) which includes at least a light emitting layer forming portion (9a) composed of, for example, a first conductivity type cladding layer (2a), an active layer (3a), and a second conductivity type cladding layer (4a) for emitting infrared light, is formed on a semiconductor substrate (1), and a red element (10b) which includes at least a light emitting layer forming portion (9b) composed of, for example, a first conductivity type cladding layer (2b), an active layer (3b), and a second conductivity type cladding layer (4b) for emitting red light, is formed on the same semiconductor substrate (1). And their second conductivity type cladding layers (4a and 4b) are made of the same material. As a result, forming process of their ridge portions may be communized and both of the elements can be formed respectively, with a window structure capable of high output operation.

17 Claims, 2 Drawing Sheets

MONOLITHIC SEMICONDUCTOR LASER

FIELD OF THE INVENTION

The present invention relates to a monolithic semiconductor laser suitable for a pickup light source of an integrated optical disk device composed of a DVD device such as a DVD (digital versatile disk), a DVD-ROM, a data writable DVD-R or the like, and a CD device such as a CD, a CD-ROM, a data writable CD-R or the like. More particularly, the present invention relates to a monolithic semiconductor laser having a structure capable of high output operation with decreasing manhours of a manufacturing process.

BACKGROUND OF THE INVENTION

In recent years, accompanied with popularization of an optical disk device which has compatibility between a DVD and a CD, a monolithic semiconductor laser, in which an InGaAlP based semiconductor laser element and an AlGaAs based semiconductor laser element are formed on the same semiconductor substrate, is used as a light source (cf. for example PATENT DOCUMENT 1).

As shown in FIG. 3, the AlGaAs based semiconductor laser element 50a is provided, on a semiconductor substrate 51 made of, for example, n-type GaAs, with, for example, a light emitting layer forming portion 59a which is composed of an n-type cladding layer 52a made of, for example, n-type AlGaAs based compound semiconductor, an active layer 53a made of AlGaAs based compound semiconductor and a p-type cladding layer 54a made of p-type AlGaAs based compound semiconductor and having a ridge shape, and a current constriction layer 55a made of n-type GaAs and formed on sides of the ridge portion, and a contact layer 56a made of, for example, p-type GaAs is provided thereon. On the other hand, the InGaAlP based semiconductor laser element 50b is provided, on the same semiconductor substrate 51 on which the AlGaAs based semiconductor laser element 50a is formed, with, for example, a light emitting layer forming portion 59b which is composed of an n-type cladding layer 52b made of, for example, n-type InGaAlP based compound semiconductor, an active layer 53b made of InGaAlP based compound semiconductor and a p-type cladding layer 54b made of p-type InGaAlP based compound semiconductor and having a ridge shape, and a current constriction layer 55b made of n-type GaAs and formed on sides of the ridge portion, and a contact layer 56b made of, for example, p-type GaAs is provided thereon. Further, p-side electrodes 57a and 57b are formed on the contact layers 56a and 56b, and a common n-side electrode 58 is formed at a back surface side of the semiconductor substrate 51, thereby a monolithic semiconductor laser is formed in which both elements are electrically separated.

PATENT DOCUMENT 1: Japanese Patent Application Laid-Open No. 2000-11417 (FIG. 9)

DISCLOSURE OF THE INVENTION

Problem to be Solved by the Present Invention

In a conventional structure, an AlGaAs based compound semiconductor material is used for the p-type cladding layer of the AlGaAs based semiconductor laser element, and an InGaAlP based compound semiconductor material is used for the p-type cladding layer of the InGaAlP based semiconductor laser element, thus, they are formed of different materials respectively. Therefore, when each of the ridge portions is formed, since a selectivity for etching and a rate of etching for a ridge forming process of the p-type cladding layers are different respectively, desired shapes can not be formed simultaneously, and it becomes necessary to carry out the etching separately, thereby manufacturing manhours increase and there arises a problem such as extreme lowering of a manufacturing yield.

In recent years, in an optical disk device which has compatibility between a DVD and a CD, a high output monolithic semiconductor laser for writing is expected in order to achieve the compatibility between a DVD-R and a CD-R, or the like, and the InGaAlP based semiconductor laser element and the AlGaAs based semiconductor laser element are required to provide higher output. It may be generally suggested as a method for enhancing output, that a current constriction layer is formed with a material which has larger band gap energy than that of the active layer, thereby forming a real (effective) refractive index structure which does not absorb light of the active layer, and thereby a lowered threshold value and enhanced efficiency are obtained. In addition, since the InGaAlP based semiconductor laser element is inferior to the AlGaAs based semiconductor laser element in temperature characteristics, there is employed a window structure, because of a reason such that enhancing output is hard to be achieved, which inhibits a catastrophic optical damage (COD) occurring near resonator mirror surfaces by varying band gap energy the active layer near the resonator mirror surface, and, at the same time, in optical design of an optical disk side, constitution in which a loss of light of the InGaAlP based semiconductor laser element can be lowered up to the most is also employed.

Corresponding to the optical design of the optical disk side, in which efficiency of taking out light of the InGaAlP based semiconductor laser element has priority, in the AlGaAs based semiconductor laser element, loss of light increases necessarily, then enhancing output is required much more than ever. Therefore, an idea may be suggested such that the window structure is employed in the AlGaAs based semiconductor laser element as in the InGaAlP based semiconductor laser element in order to enhance output.

However, materials for using for p-type cladding layers of the AlGaAs based semiconductor laser element and InGaAlP based semiconductor laser element are different. Therefore, when the window structures are formed by providing a material such as ZnO or the like on the p-type cladding layers and diffusing Zn to the active layers by solid phase diffusion, actually, desired window structures can not be formed for both elements simultaneously because a diffusion rate of Zn in each of the p-type cladding layers is different each other.

Concretely, comparing an AlGaAs based compound semiconductor layer and an InGaAlP based compound semiconductor layer, since a diffusion rate of Zn in the AlGaAs based semiconductor layer is small, in case that Zn is diffused by solid phase diffusion in order to form a window structure at the InGaAlP based semiconductor laser element side in which the p-type cladding layer is made of the InGaAlP based compound semiconductor material, Zn can not reach the active layer at the AlGaAs based semiconductor laser element side, and the window structure can not be formed in the AlGaAs based semiconductor laser element. On the other hand, if a sufficient thermal diffusion is carried out in order to change in quality of the active layer of the AlGaAs based semiconductor laser element, the diffusion rate of Zn at the InGaAlP based semiconductor laser element side is oppositely too large, and the Zn is diffused further beyond the active layer, thereby, characteristics of the InGaAlP based semiconductor laser element deteriorates, and the window structures can not be formed in both of the InGaAlP based semiconductor laser element and AlGaAs based semiconductor laser element, after all.

In addition, in case of doping Zn as a dopant for the p-type cladding layers of both elements, since Zn of a p-type dopant is diffused to the active layers at the time of doping for forming the window structures, there arises a problem such that desired element characteristics can not be maintained.

The present invention is directed to solve the above-described problem and an object of the present invention is to provide a monolithic semiconductor laser having a structure capable of communizing ridge forming processes and inhibiting lowering of a manufacturing yield.

Another object of the present invention is to provide a monolithic semiconductor laser in which both of a first wavelength semiconductor laser element and a second wavelength semiconductor laser element have window structures in order to achieve a high output operation.

Means for Solving the Problem

A monolithic semiconductor laser according to the present invention includes: a semiconductor substrate; a first wavelength semiconductor laser element provided on the semiconductor substrate, the first wavelength semiconductor laser element including a first wavelength light emitting layer forming portion which includes a first conductivity type cladding layer, an active layer and a second conductivity type cladding layer, for emitting a first wavelength light; and a second wavelength semiconductor laser element provided on a region of the semiconductor substrate, where the first wavelength semiconductor laser element is not formed, the second wavelength semiconductor laser element including a second wavelength light emitting layer forming portion which includes a first conductivity type cladding layer, an active layer and a second conductivity type cladding layer, for emitting a second wavelength light, wherein materials forming the second conductivity type cladding layers for the first and second wavelength semiconductor laser elements are the same material.

Concretely, the material of the second conductivity cladding layers for the first and second wavelength semiconductor laser elements may be a material represented by $Al_zGa_{1-z}As$ ($0.4 \leq z \leq 0.7$), or the material of the second conductivity cladding layers for the first and second wavelength semiconductor laser elements may be a material represented by $In_{0.5}(Ga_{1-x}Al_x)_{0.5}P$ ($0.5 \leq x \leq 0.9$). Here, a mixed crystal ratio 0.5 of In and $(Ga_{1-x}Al_x)$ means a ratio by which lattice matching with GaAs can be obtained.

In the above monolithic semiconductor laser, concretely, the first and second conductivity types are an n-type and a p-type respectively, the second conductivity type cladding layers for the first and second wavelength semiconductor laser elements are made of layers doped with Mg or Be, and Zn diffusion regions are formed near resonator mirror surfaces of the active layers for the first and second wavelength semiconductor laser elements.

In addition, each of the Zn diffusion regions is preferably formed by solid phase diffusion from a surface side of the semiconductor layers laminated.

Effect of the Invention

According to the present invention, since materials forming the second conductivity type cladding layers for the first and second wavelength semiconductor laser elements are the same material, there can be achieved communizing of ridge forming processes, lowering manufacturing manhours, and, at the same time, inhibiting lowering of a manufacturing yield caused by monolithizing.

In addition, since both elements are doped with Mg or Be to have a p-type conductivity and have cladding layers made of the same material, while inhibiting diffusion of a p-type dopant from the p-type cladding layers, Zn diffusion regions can be formed near resonator mirror surfaces of the active layers for emitting a first and second wavelength lights, thereby a monolithic semiconductor laser can be obtained in which both of the first wavelength and second wavelength semiconductor laser elements have window structures.

EXPLANATION OF LETTERS AND NUMERALS

Figure 1:
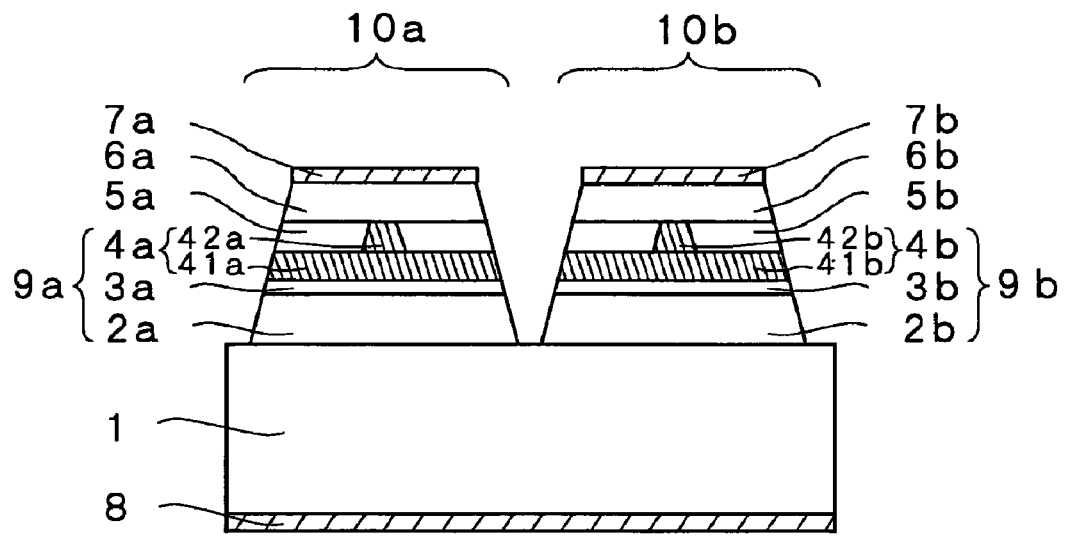
FIG. 1 is an explanatory cross-sectional view showing an embodiment of the monolithic semiconductor laser according to the present invention.

1: semiconductor substrate
4a: second conductivity type cladding layer for a first wavelength semiconductor laser element
4b: second conductivity type cladding layer for a second wavelength semiconductor laser element
9a: first wavelength light emitting layer forming portion
9b: second wavelength light emitting layer forming portion
11a: Zn diffusion region for a first wavelength semiconductor laser element
11b: Zn diffusion region for a second wavelength semiconductor laser element

THE BEST EMBODIMENT OF THE PRESENT INVENTION

An explanation will be given below of a monolithic semiconductor laser according to the present invention in reference to the drawings. As an explanatory cross-sectional view of an embodiment is shown, for example, in FIG. 1, the monolithic semiconductor laser according to the present invention is formed with an AlGaAs based semiconductor laser element 10a and an InGaAlP based semiconductor laser element 10b which are formed on the same semiconductor substrate 1. The AlGaAs based semiconductor laser element 10a (hereinafter referred to as infrared element, too) is formed, on the substrate 1, with, at least, an infrared light emitting layer forming portion 9a which includes a first conductivity type cladding layer 2a, an active layer 3a and a second conductivity type cladding layer 4a, for a first wavelength light (for example, infrared light). The InGaAlP based semiconductor laser element 10b (hereinafter referred to as red element, too) is formed, on a region of the semiconductor substrate 1 where the infrared element 10a is not formed, with, at least, a red light emitting layer forming portion 9b which includes a first conductivity type cladding layer 2b, an active layer 3b and a second conductivity cladding layer 4b, for a second wavelength light (for example, red light). And, each of the second conductivity type cladding layers 4a and 4b is made of the same material.

As the semiconductor substrate 1 for laminating these semiconductor layers, a GaAs substrate capable of obtaining lattice matching is usually used, however other compound semiconductor can be used. In addition, as a conductivity type of the semiconductor substrate 1, any one of n-type or p-type conductivity is selected which is required to the substrate side in relation to a set where the monolithic semiconductor laser is mounted, and conductivity types of semiconductor layers laminated are decided in accordance with the conductivity type of the semiconductor substrate 1. And, as described later, since it is preferable that a first conductivity type is an n-type, a second conductivity type is a p-type, and the semiconductor substrate 1 is also an n-type, in order to form a window structure by Zn diffusion, an explanation will be given by an example in which the semiconductor substrate 1 has n-type conductivity, in the following concrete examples.

As shown in FIG. 1, the light emitting layer forming portions 9a and 9b include, at least, first conductivity type cladding layers (n-type cladding layers 2a and 2b), active layers 3a and 3b, and second conductivity type cladding layers (p-type cladding layers 4a and 4b).

In order to form the light emitting layer forming portions 9a and 9b, generally, the AlGaAs based material is mainly used so that the first wavelength light has a wavelength of a 780 nm band and the InGaAlP based material is mainly used so that the second wavelength light has a wavelength of a 650 nm band. In case of selecting other wavelength, known materials may be selected. Here, the AlGaAs based material means a material represented by $Al_zGa_{1-z}As$ ($0 \leq z \leq 1$), and the InGaAlP based material means a material represented by $In_{0.5}(Ga_{1-x}Al_x)_{0.5}P$ ($0 \leq x \leq 1$).

The first conductivity type cladding layers (n-type cladding layers 2a and 2b) are formed on the semiconductor substrate 1. And, buffer layers or the like maybe provided between each of the n-type cladding layers 2a and 2b, and the semiconductor substrate 1. It is preferable that the n-type cladding layers 2a and 2b are made of materials having larger band gap energy than that of the active layers 3a and 3b, respectively, from the view point such that light and current confinement are easily achieved. In addition, it is not always necessary that materials of the n-type and p-type cladding layers are same, in the case of the present invention in which the same material is used for the second conductivity type cladding layers (p-type cladding layers 4a and 4b) corresponding thereto, it is preferable to use the same material for the n-type cladding layers from the view point of maintaining a symmetry of a light density distribution to the active layers and enabling a light confinement effect to be realized up to the most. And, it may be generally suggested that Si or Se is doped in order to have an n-type conductivity.

Figure 2:
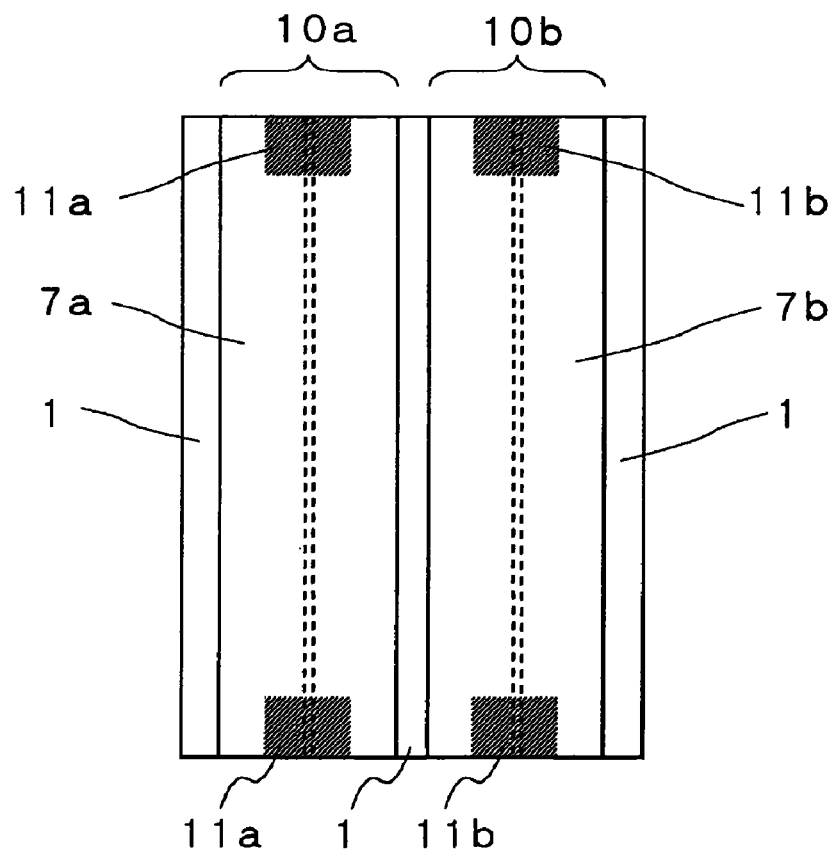
FIG. 2 is an explanatory plan view showing the embodiment of the monolithic semiconductor laser according to the present invention.
Figure 3:
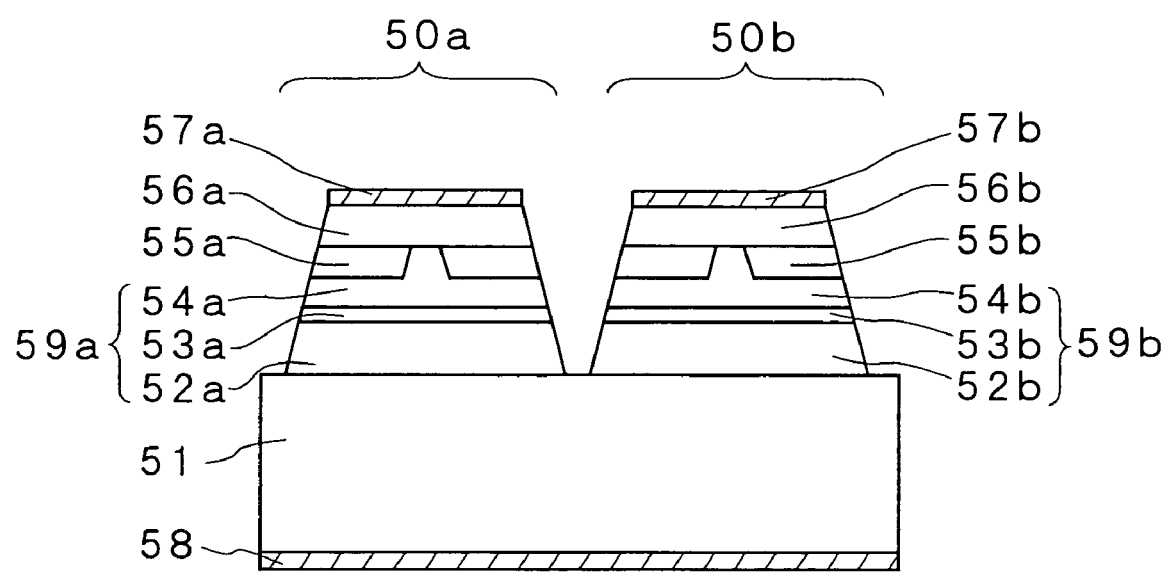
FIG. 3 is an explanatory cross-sectional view showing a monolithic semiconductor laser by the prior art.

The active layers 3a and 3b are formed on the n-type cladding layers 2a and 2b, respectively. The active layers may be formed with a bulk structure, however, as shown in FIG. 2, in case of a structure of diffusing Zn or the like at surroundings of resonator mirror surfaces (in case of having a window structure) thereby forming Zn diffusion regions 11a and 11b, the active layers preferably may be formed with a quantum well structure, because varying the band gap energy can not be realized if the active layers do not have a quantum well structure. In addition, the quantum well structure may be a single quantum well structure or multi quantum well structure. And, depending on necessity, guide layers or the like may be formed and the active layers may be formed with a p-type conductivity layer, an n-type conductivity layer or a non-doped layer.

Especially, the red element is inferior to the infrared element in temperature characteristics, and hard to achieve higher output, then a window structure is required, in the red element, to be employed which inhibits a catastrophic optical damage (COD) occurring near resonator mirror surfaces by diffusing Zn to the active layer near the resonator mirror surfaces. In addition, under a state such that a constitution in which a loss of light of the red element can be lowered up to the most is employed in optical design of an optical disk side, since the infrared element generates a loss of light corresponding to such optical design of the optical disk side, higher output is required more than ever, and it is preferable that the infrared element also employs the window structure having a Zn diffusion region in order to increase output same as in the red element, in order to form a monolithic semiconductor laser for writing.

As shown in FIG. 2, the Zn diffusion regions 11a and 11b are formed at portions near resonator mirror where a wafer is divided into chips. Now, FIG. 2 is an explanatory plan view showing a structure of a case in which window structures having Zn diffusion regions are formed for both elements in order to enhance output of a monolithic semiconductor laser. The Zn diffusion regions 11a and 11b are formed by providing ZnO films or the like on the p-type cladding layers 4a and 4b which is a surface side of the semiconductor layers grown on the semiconductor substrate 1, and diffusing Zn so as to reach the active layers 3a and 3b by solid phase diffusion. Thereby, the active layers are varied in band gap energy, that is, band gap energy of the active layers at the Zn diffusion region becomes larger than that of the internal active layers of the resonator not provided with the Zn diffusion regions, and there can be prevented absorption of light occurring near the resonator mirror surfaces, and the COD caused by increasing of output occurring near the resonator mirror surfaces. In addition, it is sufficient that the Zn diffusion regions 11a and 11b are formed at a light emitting portion of the active layers near the resonator mirror surfaces, and it is not necessary to form at all of the resonator mirror surfaces. And, if the Zn diffusion regions are formed at light emitting surface sides, they are not always necessary at the opposite surface sides. More concretely, the Zn diffusion regions are formed with a size of approximately 50 μm from the resonator mirror surface in an direction of the internal resonator.

When such window structures are formed, if materials of the second conductivity type cladding layers 4a and 4b are different, desired window structure actually can not be formed for both elements because diffusion rates of Zn are different, however, in the present invention, since the same material is used for the second conductivity type cladding layers as described later, the desired window structures can be obtained not only for the red element but also for the infrared element.

In an example shown in FIG. 1, the second conductivity type cladding layers (p-type cladding layers 4a and 4b) are formed on the active layers and with a ridge shape, and the second conductivity type cladding layers for the infrared and red elements are made of the same material according to the present invention. Concretely, a material represented by $Al_zGa_{1-z}As$ ($0 \leq z \leq 1$) or $In_y(Ga_{1-x}Al_x)_{1-y}P$ ($0 \leq x \leq 1$, $0 \leq y \leq 1$) is used. Since each of such materials has a similar lattice constant to that of the substrate, crystal growth thereof is comparatively easy and quality of semiconductor layers can be improved. And, it is preferable to use a material having larger band gap energy than that of the active layer because a hetero junction structure capable of confinement of current and light can be formed.

In such manner, by using the same material for each of the second conductivity cladding layers, etching can be carried out under the same condition at the time of ridge forming processes, thereby the etching and removing processes can be communized, then, lowering of a manufacturing yield can be inhibited. In addition, when window structures are formed by providing a material such as ZnO or the like on the p-type cladding layers formed at growing surface sides of the semiconductor layers grown on the semiconductor substrate, forming Zn diffusion regions by diffusing Zn so as to reach the active layers by solid phase diffusion, if the materials of the second conductivity type layers 4a and 4b are different, desired window structures actually can not be formed for both elements because diffusion rates of Zn are different. However, according to the present invention, since the same material is used for the second conductivity type cladding layers, the diffusion rates of Zn in the p-type cladding layers 4a and 4b become equal, and time to reach each of the active layers is approximately equal even when solid diffusion is carried out, thereby desired window structures can be formed not only in the red element but also in the infrared element.

In addition, when the second conductivity type cladding layers are made of the same material, in case of growing them by using a MOCVD (metal organic compound vapor deposition) apparatus or the like, an arsenic based material and a phosphorus based material are required to be grown sequentially, but it is technically difficult to form the arsenic based material and the phosphorus based material sequentially at a surrounding of the active layers, and deterioration of characteristics may occur. Namely, after growing the active layers made of the arsenic or phosphorus based material, if the p-type cladding layers made of the arsenic or phosphorus based material are formed, a growing atmosphere of the MOCVD apparatus required to be changed from arsenic to phosphorus or from phosphorus to arsenic. And, if the atmosphere is not changed sufficiently, complex compound of arsenic and phosphorus is formed, and, on the contrary, the time for changing the atmosphere is too long, crystal defects at changing surfaces are apt to occur, and the crystal defects at surroundings of the active layers lead to deterioration of characteristics. However, the present inventor prevented such trouble by optimizing a timing of changing the atmospheres of arsenic and phosphorus.

In addition, in case of using Zn for dopants for the p-type cladding layers of both elements, since even the p-type dopant is diffused to the active layers at the time of solid phase diffusion, and desired characteristics of the elements occasionally can not be maintained, Be or Mg having a small diffusion rate is preferably used as the dopant in place of Zn.

In addition, by dividing each of the p-type cladding layers 4a and 4b into two, etching stop layers or the like may be provided therebetween, and cap layers or the like may be also provided on the p-type cladding layers 4a and 4b. In this case, since each layer of the etching stop layers and cap layers is thin itself, if materials for forming the layers in the infrared and red elements are different, influence to a diffusion rate is small when Zn is diffused for forming window structures. Of course, the same material is preferably used for forming the window structures with a higher definition. And, it is preferable to use Be or Mg as a p-type dopant by the same reason as that of using Mg or Be for the p-type cladding layers.

Concretely, the above-described light emitting layer forming portions 9a and 9b are formed with constitutions described below. For example, in the light emitting layer forming portions 9a of the infrared element, there are laminated on the n-type GaAs substrate 1, the n-type cladding layer 2a having a thickness of approximately 1 to 10 μm and made of n-type $In_{0.5}(Ga_{1-x4}Al_{x4})_{0.5}P$ ($0.3 \leq x4 \leq 0.9$, for example x4=0.7) (though $Al_{z1}Ga_{1-z1}As$ ($0.4 \leq z1 \leq 0.7$, for example z=0.5) can be used as conventional, it is preferable to use the above-described material from the view point of symmetry to the p-type cladding layer 4a), and the active layer 3a having a total thickness of approximately 0.04 to 0.2 μm on the n-type cladding layer 2a, with a single or multi quantum well structure of a well layer made of undoped $Al_{z2}Ga_{1-z2}As$ ($0.04 \leq z2 \leq 0.2$, for example z2=0.1) not shown in the figure, and a barrier layer made of undoped $Al_{z3}Ga_{1-z3}As$ ($0.1 \leq z3 \leq 0.5$, for example z=0.3) not shown in the figure. Then, there are formed a p-type first cladding layer 41a having a thickness of approximately 0.05 to 0.5 μm and made of $In_{0.5}(Ga_{1-x4}Al_{x4})_{0.5}P$ ($0.3 \leq x4 \leq 0.9$, for example x4=0.7), on the active layer 3a, a p-type etching stop layer not shown in the figure having a thickness of approximately 0.005 to 0.05 μm and made of $In_{y5}(Ga_{1-x5}Al_{x5})_{1-y5}P$ ($0 \leq x5 \leq 0.5$, $0 \leq y5 \leq 0.5$, for example x5=0 and y5=0.35), a p-type second cladding layer 42a having a thickness of approximately 0.5 to 3 μm and made of $In_{0.5}(Ga_{1-x6}Al_{x6})_{0.5}P$ ($0.3 \leq x6 \leq 0.9$, for example x6=0.7), and a p-type cap layer not shown in the figure having a thickness of approximately 0.01 to 0.3 μm and made of $In_{0.5}(Ga_{1-x7}Al_{x7})_{0.5}P$ ($0 \leq x7 \leq 0.5$, for example x7=0), thereafter a ridge portion is formed at the p-type cladding layer 4a by removing a part of the cap layer and the p-type second cladding layer by etching to the etching stop layer not shown in the figure (border portion of the p-type first cladding layer 41a and the p-type second cladding layer 42a). On the other hand, in the light emitting layer forming portions 9b of the red element side, there are laminated, on a region of the n-type GaAs substrate 1, where the light emitting layer forming portion 9a is not formed, the n-type cladding layer 2b having a thickness of approximately 1 to 10 μm and made of n-type $In_{0.5}(Ga_{1-x1}Al_{x1})_{0.5}P$ ($0.3 \leq x1 \leq 0.9$, for example x1=0.7) doped with Si, and the active layer 3b thereon having a total thickness of approximately 0.04 to 0.2 μm with a single or multi quantum well structure of a compressively strained quantum well layer made of undoped $In_{y2}(Ga_{1-x2}Al_{x2})_{1-y2}P$ ($0 \leq x2 \leq 0.1$, $0 \leq y2 \leq 0.55$, for example x2=0, y2=0.53), and a barrier layer made of undoped $In_{0.5}(Ga_{1-x3}Al_{x3})_{0.5}P$ ($0.1 \leq x3 \leq 0.5$, for example x3=0.5). Then, there are formed a p-type first cladding layer 41b, on the active layer 3b, made of the same material as in the infrared element, a p-type etching stop layer not shown in the figure, a p-type second cladding layer 42b, and a cap layer not shown in the figure, thereafter a ridge portion is formed at the p-type cladding layer 4b by removing a part of the p-type cap layer and the p-type second cladding layer by etching.

In addition, as another constitution, although the constitution of the n-type cladding layers 2a and 2b, and the active layers 3a and 3b are same as described above, there may be formed a p-type first cladding layer 41a and 41b having a thickness of approximately 0.05 to 0.5 μm and made of $Al_{z4}Ga_{1-z4}As$ ($0.4 \leq z4 \leq 0.7$, for example z4=0.5) on the active layers 3a and 3b, p-type etching stop layers not shown in the figure having a thickness of approximately 0.005 to 0.05 μm and made of $Al_{z5}Ga_{1-z5}As$ ($0.1 \leq z5 \leq 0.4$, for example z5=0.2), p-type second cladding layers 42a and 42b having a thickness of approximately 0.5 to 3 μm and made of $Al_{z6}Ga_{1-z6}As$ ($0.4 \leq z6 \leq 0.7$, for example z6=0.5) and cap layers not shown in the figure having a thickness of approximately 0.01 to 0.3 μm and made of GaAs thereon, thereafter ridge portions may be formed at the p-type cladding layers 4a and 4b. In addition, besides the light emitting layer formation portion with the above-described constitution, materials of other system may be used, for example, for a part of the light emitting layer forming portions 9a and 9b, if necessary.

At each ridge side portion of the second conductivity cladding layers 4a and 4b with a ridge shape, current constriction layers 5a and 5b are provided. Each of the current constriction layers is a layer for adjusting light confinement and current constriction, and material having such function may be used for them. Of course, it is preferable that a real refraction (effective refraction index) type structure is formed by using a material having larger band gap energy than that of the active layer, because output can be enhanced by preventing absorption of light emitted in the active layer. In addition, in case of employing the real (effective) refractive index structure, it is preferable that the current constriction layers are made of the same material, because growth for filling can be carried out simultaneously and the number of growth processes can be decreased. In addition, layers made of GaAs or the like which has a function of adjusting an effect of current constriction or light confinement, or a function of a protection layer, may be laminated on the current constriction layers $5a$ and $5b$ for infrared and red light.

Concretely, at both sides of each of the p-type second cladding layers $4a$ and $4b$ and the cap layers not shown in the figure, current constriction layers $5a$ and $5b$ are formed which has a thickness of, for example, approximately 0.1 to 3 μm and for example 0.4 μm, and are made of materials represented by n-type $Al_{z8}Ga_{1-z8}As$ ($0.5 \leq z8 \leq 0.8$, for example $z8=0.6$) or $In_{y8}(Ga_{1-x8}Al_{x8})_{1-y8}P$ ($0.6 \leq x8 \leq 1$, $0 \leq y8 \leq 1$, for example $x8=0.75$ and $y8=0.5$) which is doped with Si. In addition, on each of the current constriction layers, protection layers $11a$ and $11b$ having a thickness of approximately 0.01 to 3 μm, for example 0.5 μm, and made of n-type GaAs are provided.

Contact layers $6a$ and $6b$ are formed with a thickness of, for example, approximately 0.1 to 10 μm and of p-type GaAs or the like on the light emitting layer forming portions $9a$ and $9b$, and the current constriction layers $5a$ and $5b$. The p-side electrodes $7a$ and $7b$ are formed on surfaces of the contact layers $6a$ and $6b$, by sputtering or vaporizing Ti/Au or the like. And, the n-side electrode $8$ is formed of Au—Ge/Ni or the like on a back surface of the semiconductor substrate $1$ after being thinned by polishing or the like. Thickness or material can be selected properly as conventional.

Although the present invention is explained by the example shown in FIG. 1 which has a ridge structure having p-type cladding layers with a ridge shape, the present invention can be applied to a monolithic semiconductor laser which is formed by combination of semiconductor laser elements of a SAS structure of a two time growth type.

In order to manufacture a semiconductor laser having the above-described structure, firstly, a light emitting layer forming portion $9a$ including an active layer $3a$ is formed on a substrate $1$ for forming an infrared element $10a$. The light emitting layer forming portion $9a$ is formed, for example, by setting the n-type GaAs substrate $1$ within, for example, a MOCVD apparatus, supplying necessary materials such as triethyl gallium (TEG), trimethyl aluminium (TMA), triethyl indium (TMIn), phosphine ($PH_3$) and arsine ($AsH_3$) as a reaction gas, $SiH_4$ as an n-type dopant gas and biscyclopentadienyl magnesium ($Cp_2Mg$) as a p-type dopant gas, or the like, depending on a conductivity type of semiconductor layers, together with hydrogen ($H_2$) as a carrier gas, and growing the n-type cladding layer $2a$ doped with Si, the active layer $3a$ having a multi quantum well structure, and the p-type cladding layer $4a$ doped with Mg, by epitaxial growth of each of the semiconductor layers at a temperature of approximately 500 to 700° C. Subsequently, the GaAs substrate $1$ is exposed by masking a region except a place, where a red element $10b$ is planed to be formed, using a photo resist or the like, and removing semiconductor layers exposed from the mask which is already laminated for the light emitting layer forming portion $9a$ of the infrared element, by wet etching or the like using an etchant such as a mixture of sulfuric acid and hydrogen peroxide solution, or the like. After removing the photo resist, the GaAs substrate is set within the MOCVD apparatus again, and, in order to form a light emitting layer forming portion $9b$ of the red element, there are grown in order the n-type cladding layer $2b$ doped with Si, the active layer $3b$ having a multi quantum well structure, and the p-type cladding layer $4b$ doped with Mg made of the same material as that of the infrared element. Then, the light emitting layer forming portion $9b$ laminated on the light emitting layer forming portion $9a$ is removed by wet etching or the like using an etchant such as hydrochloric acid or the like.

Subsequently, Zn diffusion regions $11a$ and $11b$ are formed near resonator mirror surfaces of the light emitting layer forming portions $9a$ and $9b$ of the infrared and red elements. Concretely, Zn diffusion sources such as ZnO layers or the like having a thickness of approximately 50 nm are formed on regions of the p-type cladding layers on the light emitting layer forming portions $9a$ and $9b$, where cleavage is carried out, by a sputtering method, and annealing at a temperature of approximately 400 to 700° C. and for approximately 10 to 240 min, or the like is carried out so as to diffuse Zn in the Zn diffusion source to the active layers by solid phase diffusion, thereby the Zn diffusion regions $11a$ and $11b$ are formed. Thereafter, the ZnO or the like is removed by hydrofluoric acid or the like. AS a result, in the Zn diffusion regions $11a$ and $11b$, since quantum well structures of the active layers $3a$ and $3b$ are changed in quality by the Zn and band gap thereof becomes large, window structures are formed at the resonator mirror surfaces after cleavage, absorption of light from inside is inhibited at the resonator mirror surfaces, and temperature is prevented from rising up to the most, thereby the COD can be prevented. In addition, since the p-type cladding layers of both elements are made of the same material, the Zn diffusion is carried out with the same diffusion rate and the Zn diffusion regions can be formed for both elements. And, since Mg is doped as a dopant of the p-type cladding layers, when Zn is diffused by solid phase diffusion, Mg is hardly diffused and element characteristics can not be deteriorated.

Subsequently, in order to form the ridge portions of the light emitting layer forming portions $9a$ and $9b$ respectively, a mask made of $SiO_2$, $SiN_x$ or the like is formed, for example, by a CVD method or the like, and the p-type second cladding layers $4a$ and $4b$ are etched simultaneously, for example, by dry etching or by an etching solution such as hydrochloric acid or a mixed solution of tartaric acid and hydrogen peroxide solution, thereby the ridge portions having a convex shape are formed. Here, forming the convex shape may be carried out by removing till etching reaches the etching stop layer, when an etching stop layer is formed, or the active layer. In such manner according to the present invention, since the p-type cladding layers of both elements are made of the same material, and etching selectivity and etching rate of the p-type cladding layers are same, desired ridge shape can be obtained even if etching is carried out simultaneously. Subsequently, the current constriction layers $5a$ and $5b$ are filled simultaneously, at least, at sides of both narrow width portions of the convex shape. Filling the current constriction layers are carried out by a selective growth using a mask made with an insulating film. Here, the selective growth is a method, by which only sides of the ridge portion of the convex shape are filled with current constriction layers selectively without forming the current constriction layers on the mask, and can be carried out by a modified condition from a usual condition such as a growth temperature and pressure or the like.

Thereafter, the mask made with an insulating film is removed by hydrofluoric acid or the like. Sequentially, contact layers $6a$ and $6b$ made of, for example, GaAs are formed, thereby the infrared element $10a$ and the red element $10b$ are formed. In addition, in order to separate the infrared element 10a and the red element 10b electrically, a region except a dividing region is masked by a photo resist or the like, and the dividing region is etched to the GaAs substrate 1 by using an etchant such as hydrochloric acid, mixed solution of sulfuric acid and hydrogen peroxide solution, or the like.

Finally, the p-side electrodes 7a and 7b respectively made of, for example, Au—Ge/Ni or the like are formed on surfaces of the contact layers 6a and 6b, and the n-side electrode 8 made of Ti/Au or the like is formed on a back surface of the semiconductor substrate 1, by vacuum evaporation or the like. After the formation of the electrodes, the wafer is divided into chips by cleaving so that the Zn diffusion regions are the resonator mirror surfaces, thereby laser chips are formed.

INDUSTRIAL APPLICABILITY

The monolithic semiconductor laser according to the present invention can be used for a pickup light source of an integrated optical disk device composed of a DVD device such as a DVD (digital versatile disk), a DVD-ROM, a data writable DVD-R or the like, and a CD device such as a CD, a CD-ROM, a data writable CD-R or the like.

What is claimed is:

1. A monolithic semiconductor laser comprising:
   a semiconductor substrate;
   a first wavelength semiconductor laser element provided on the semiconductor substrate, the first wavelength semiconductor laser element comprising a first wavelength light emitting layer forming portion which includes a first conductivity type cladding layer, an active layer and a second conductivity type cladding layer, for emitting a first wavelength light; and
   a second wavelength semiconductor laser element provided on a region of the semiconductor substrate, where the first wavelength semiconductor laser element is not formed, the second wavelength semiconductor laser element comprising a second wavelength light emitting layer forming portion which includes a first conductivity type cladding layer, an active layer and a second conductivity type cladding layer, for emitting a second wavelength light,
   wherein a buffer layer is provided between the substrate and the first conductivity type cladding layers of the first wavelength semiconductor laser element and the second wavelength semiconductor laser element,
   wherein materials forming the second conductivity type cladding layers for the first and second wavelength semiconductor laser elements are the same material, and
   wherein each of the second conductivity type layers of the light emitting layer forming portions of the first and second wavelength semiconductor laser elements is formed with a ridge structure in which a ridge portion is formed, and first conductivity type current constriction layers are provided at sides of the ridge portions, each of the first conductivity type current constriction layers of the first and second wavelength semiconductor laser elements having larger band gap energy than that of the active layer thereof, and being made of the same material each other.

2. The monolithic semiconductor laser according to claim 1, wherein the material of the second conductivity cladding layers for the first and second wavelength semiconductor laser elements is a material represented by $Al_zGa_{1-z}As$ ($0.4 \leq z \leq 0.7$).

3. The monolithic semiconductor laser according to claim 1, wherein the material of the second conductivity cladding layers for the first and second wavelength semiconductor laser elements is a material represented by $In_{0.5}(Ga_{1-x}Al_x)_{0.5}P$ ($0.5 \leq x \leq 0.9$).

4. The monolithic semiconductor laser according to claim 1, wherein the first and second conductivity types are an n-type and a p-type respectively, the second conductivity type cladding layers for the first and second wavelength semiconductor laser elements are made of layers doped with Mg or Be, and Zn diffusion regions are formed near resonator mirror surfaces of the active layers for the first and second wavelength semiconductor laser elements.

5. The monolithic semiconductor laser according to claim 4, wherein each of the Zn diffusion regions is formed by solid phase diffusion from a surface side of the semiconductor layers laminated.

6. The monolithic semiconductor laser according to claim 1, wherein materials forming the first conductivity type cladding layers for the first and second wavelength semiconductor laser elements are the same material.

7. The monolithic semiconductor laser according to claim 1, wherein the first and second wavelength semiconductor laser elements are provided with etching stop layers interposed at a bottom surface of each of the ridge portions of the light emitting layer forming portions and=cap layers are provided on surfaces of the ridge portions, and the etching stop layers are made of the same material and the cap layers are made of the same material, for the first and second wavelength semiconductor laser elements, respectively.

8. The monolithic semiconductor laser according to claim 1, wherein the material of the first conductivity type current constriction layers for the first and second wavelength semiconductor laser elements is a material represented by $Al_{z8}Ga_{1-z8}As$ ($0.5 \leq z8 \leq 0.8$).

9. The monolithic semiconductor laser according to claim 1, wherein the material of the first conductivity type current constriction layers for the first and second wavelength semiconductor laser elements is a material represented by $In_{0.5}(Ga_{1-x8}Al_{x8})_{0.5}P$ ($0.6 \leq x8 \leq 1.0$).

10. A monolithic semiconductor laser comprising:
    a semiconductor substrate;
    a first wavelength semiconductor laser element provided on the semiconductor substrate, the first wavelength semiconductor laser element comprising a first wavelength light emitting layer forming portion which includes a first conductivity type cladding layer, an active layer and a second conductivity type cladding layer, for emitting a first wavelength light; and
    a second wavelength semiconductor laser element provided on a region of the semiconductor substrate, where the first wavelength semiconductor laser element is not formed, the second wavelength semiconductor laser element comprising a second wavelength light emitting layer forming portion which includes a first conductivity type cladding layer, an active layer and a second conductivity type cladding layer, for emitting a second wavelength light,
    wherein a buffer layer is provided between the substrate and the first conductivity type cladding layers of the first wavelength semiconductor laser element and the second wavelength semiconductor laser element,
    wherein materials forming the second conductivity type cladding layers for the first and second wavelength semiconductor laser elements are the same material,
    wherein each of the second conductivity type layers of the light emitting layer forming portions of the first and second wavelength semiconductor laser elements is formed with a ridge structure in which a ridge portion is formed, and first conductivity type current constriction layers are provided at sides of the ridge portions, each of the first conductivity type current constriction layers of the first and second wavelength semiconductor laser elements having larger band gap energy than that of the active layer thereof, and being made of the same material each other, and wherein the first and second wavelength semiconductor laser elements are provided with etching stop layers interposed at a bottom surface of each of the ridge portions of the light emitting layer forming portions and cap layers are provided on surfaces of the ridge portions, and the etching stop layers are made of the same material and the cap layers are made of the same material, for the first and second wavelength semiconductor laser elements, respectively.

11. The monolithic semiconductor laser according to claim 10, wherein the material of the second conductivity cladding layers for the first and second wavelength semiconductor laser elements is a material represented by $Al_zGa_{1-z}As$ ($0.4 \leq z \leq 0.7$).

12. The monolithic semiconductor laser according to claim 10, wherein the material of the second conductivity cladding layers for the first and second wavelength semiconductor laser elements is a material represented by $In_{0.5}(Ga_{1-x}Al_x)_{0.5}P$ ($0.5 \leq x \leq 0.9$).

13. The monolithic semiconductor laser according to claim 10, wherein the first and second conductivity types are an n-type and a p-type respectively, the second conductivity type cladding layers for the first and second wavelength semiconductor laser elements are made of layers doped with Mg or Be, and Zn diffusion regions are formed near resonator mirror surfaces of the active layers for the first and second wavelength semiconductor laser elements.

14. The monolithic semiconductor laser according to claim 13, wherein each of the Zn diffusion regions is formed by solid phase diffusion from a surface side of the semiconductor layers laminated.

15. The monolithic semiconductor laser according to claim 10, wherein materials forming the first conductivity type cladding layers for the first and second wavelength semiconductor laser elements are the same material.

16. The monolithic semiconductor laser according to claim 10, wherein the material of the first conductivity type current constriction layers for the first and second wavelength semiconductor laser elements is a material represented by $Al_{z8}Ga_{1-z8}As$ ($0.5 \leq z8 \leq 0.8$).

17. The monolithic semiconductor laser according to claim 10, wherein the material of the first conductivity type current constriction layers for the first and second wavelength semiconductor laser elements is a material represented by $In_{0.5}(Ga_{1-x8}Al_{x8})_{0.5}P$ ($0.6 \leq x8 \leq 1.0$).

* * * * *